(12) United States Patent
Hwang et al.

(10) Patent No.: US 10,381,590 B2
(45) Date of Patent: Aug. 13, 2019

(54) ELECTRODE LAMINATE AND ORGANIC LIGHT EMITTING DEVICE ELEMENT

(71) Applicant: LG DISPLAY CO., LTD., Seoul (KR)

(72) Inventors: Jin Ha Hwang, Daejeon (KR); Seongsu Jang, Daejeon (KR); Young Eun Kim, Daejeon (KR); Seong Cheol Kim, Daejeon (KR); Sung Soo Park, Daejeon (KR); Kwang Myung Seo, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/905,565

(22) PCT Filed: Jul. 21, 2014

(86) PCT No.: PCT/KR2014/006585
§ 371 (c)(1),
(2) Date: Jan. 15, 2016

(87) PCT Pub. No.: WO2015/009121
PCT Pub. Date: Jan. 22, 2015

(65) Prior Publication Data
US 2016/0172619 A1 Jun. 16, 2016

(30) Foreign Application Priority Data

Jul. 19, 2013 (KR) .................. 10-2013-0085699

(51) Int. Cl.
*H01L 23/02* (2006.01)
*H01L 29/72* (2006.01)
(Continued)

(52) U.S. Cl.
CPC ...... *H01L 51/5212* (2013.01); *H01L 51/5209* (2013.01); *H01L 51/5218* (2013.01);
(Continued)

(58) Field of Classification Search
CPC .............................. H01L 23/02; H01L 29/72
See application file for complete search history.

(56) References Cited

U.S. PATENT DOCUMENTS 6,133,581 A  10/2000 Terao et al.
6,215,077 B1  4/2001 Utsumi et al.
(Continued)

FOREIGN PATENT DOCUMENTS

CN  1615452 A  5/2005
CN  102231385 A  11/2011
(Continued)

OTHER PUBLICATIONS

Title: KR 10-2013-0033093 Machine Translation Translated date: Dec. 21, 2016 Publisher: European Patent office Pertinent Page: pp. 9-17.*

*Primary Examiner* — Joseph C. Nicely
*Assistant Examiner* — Lamont B Koo
(74) *Attorney, Agent, or Firm* — Dentons US LLP

(57) ABSTRACT

The present specification provides an electrode laminate including a substrate, an electrode provided on the substrate, and an auxiliary electrode electrically connecting to the electrode and has a laminated structure of a first layer having reflectivity of 80% or greater at a wavelength of 550 nm and a second layer having a higher etching rate compared to the first layer, wherein the auxiliary electrode is either provided between the electrode and the substrate, or provided so that the first layer of the auxiliary electrode adjoins at least part of the side surface of the electrode, and an organic light emitting device including the electrode laminate.

26 Claims, 5 Drawing Sheets

(51) Int. Cl.
*H01L 51/52* (2006.01)
*H05B 33/26* (2006.01)

(52) U.S. Cl.
CPC ......... *H01L 51/5262* (2013.01); *H05B 33/26* (2013.01); *H01L 2251/301* (2013.01); *H01L 2251/5338* (2013.01)

(56) References Cited

U.S. PATENT DOCUMENTS

| | | | |
|---|---|---|---|
| 6,525,467 B1* | 2/2003 | Eida | H01L 27/3281 313/504 |
| 7,868,543 B2 | 1/2011 | Kobayashi | |
| 8,592,852 B2 | 11/2013 | Ibe et al. | |
| 8,920,683 B2 | 12/2014 | Yano et al. | |
| 2002/0057053 A1* | 5/2002 | Hitoshi | H01L 51/5284 313/505 |
| 2005/0173732 A1 | 8/2005 | Yu et al. | |
| 2009/0153046 A1 | 6/2009 | Hayashi et al. | |
| 2011/0049493 A1 | 3/2011 | Jun | |
| 2011/0084253 A1 | 4/2011 | Kim | |
| 2012/0248489 A1* | 10/2012 | Yoshizumi | H01L 51/5212 257/99 |
| 2013/0182418 A1 | 7/2013 | Sawabe et al. | |
| 2013/0192872 A1 | 8/2013 | Hwang et al. | |
| 2013/0270994 A1 | 10/2013 | Sakaguchi et al. | |

FOREIGN PATENT DOCUMENTS

| | | |
|---|---|---|
| DE | 19812197 A1 | 10/1998 |
| GB | 2329506 A | 3/1999 |
| JP | 2000-082588 A | 3/2000 |
| JP | 2001-311954 A | 11/2001 |
| JP | 2004-119216 A | 4/2004 |
| JP | 2011-210819 A | 10/2011 |
| JP | 2012-009420 A | 1/2012 |
| KR | 2012-0078642 A | 7/2012 |
| KR | 2013-0033093 A | 4/2013 |
| WO | 03/026357 A1 | 3/2003 |
| WO | 2012086758 A1 | 6/2012 |

* cited by examiner

[Fig. 1]
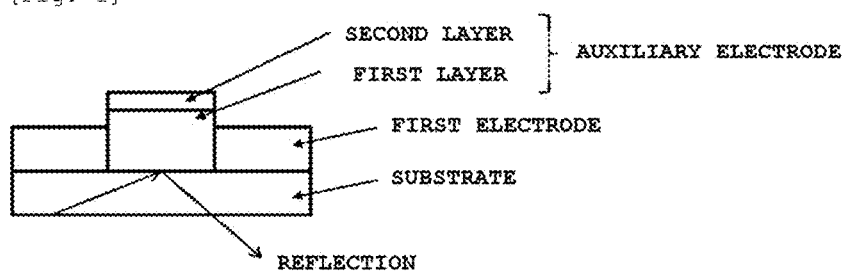
[Fig. 2]
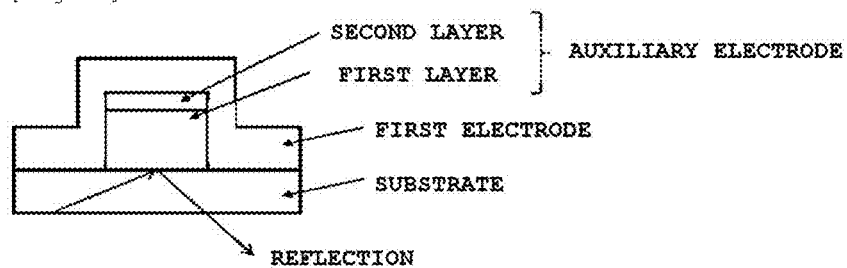

[Fig. 3]
LIGHT EMITTING DIRECTION
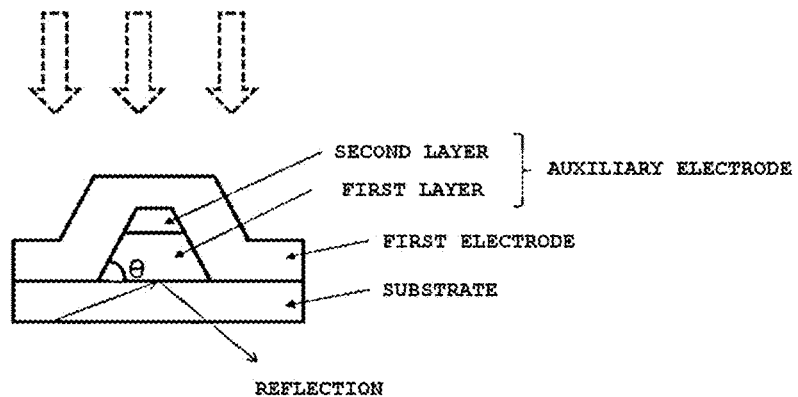
[Fig. 4]
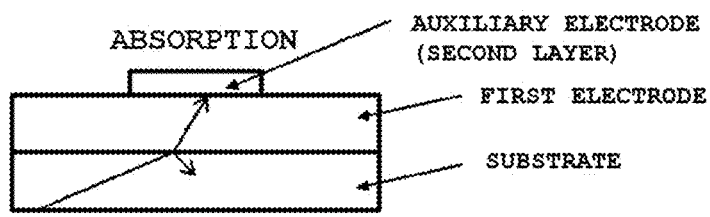
[Fig. 5]
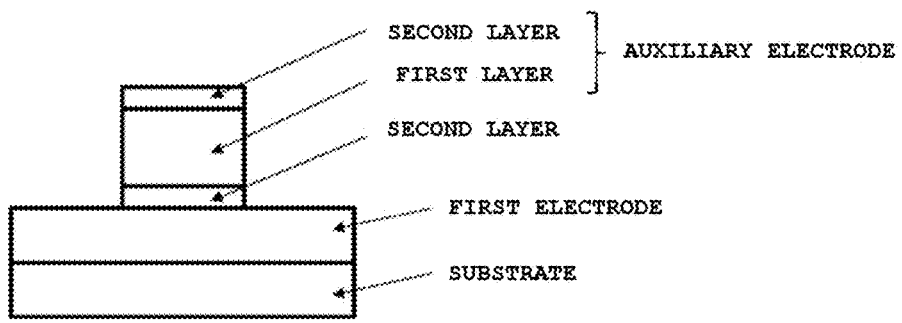

[Fig. 6]
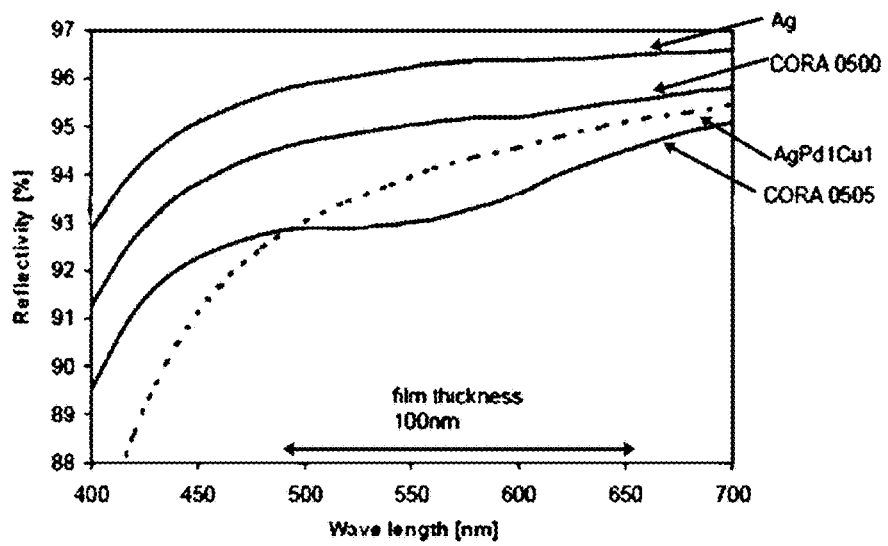
[Fig. 7]
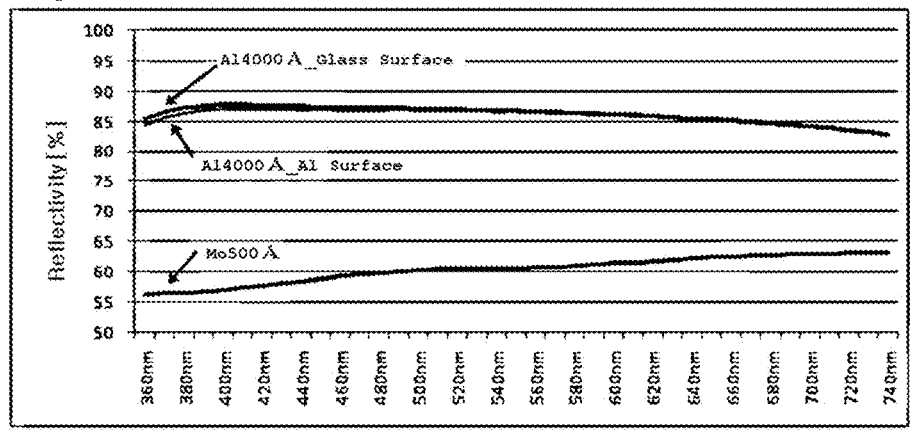

[Fig. 8]
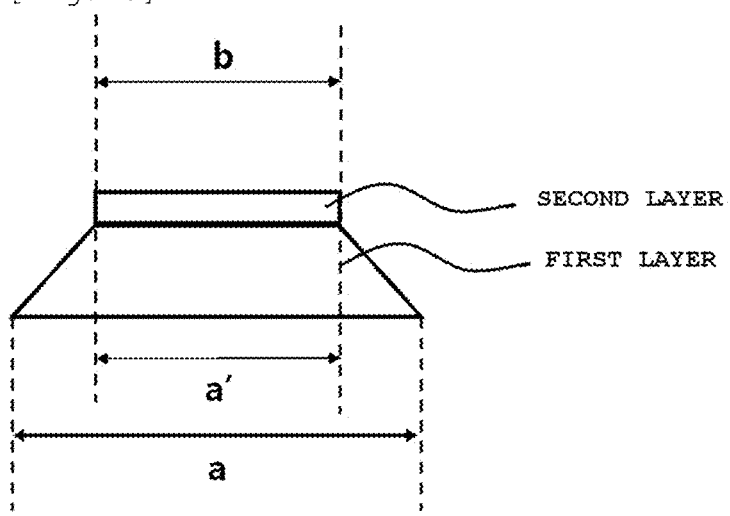
[Fig. 9]
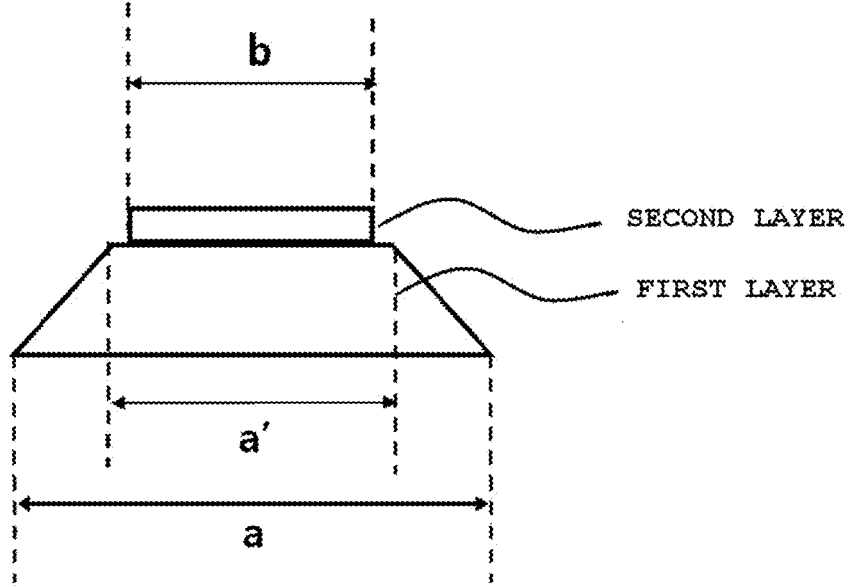

[Fig. 10]
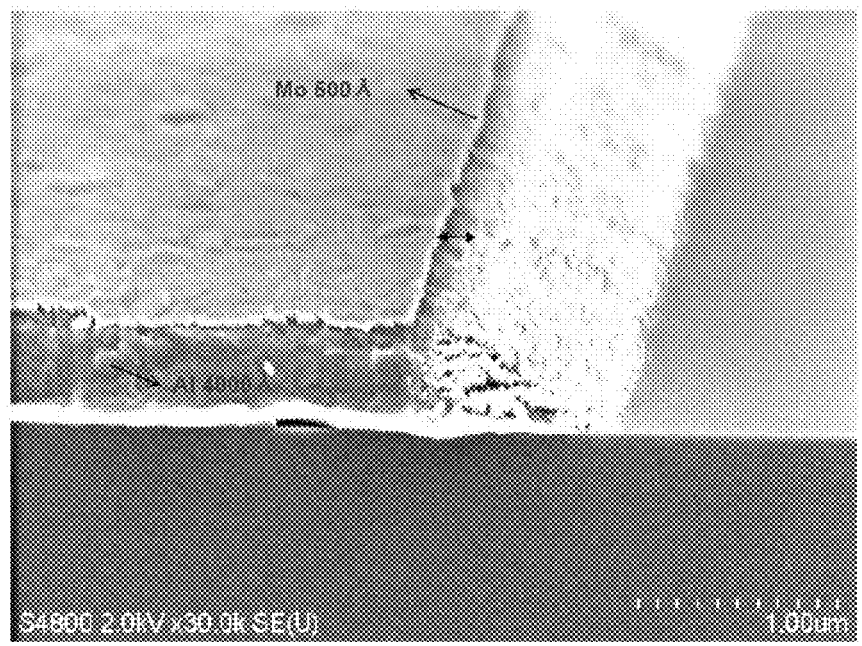
[Fig. 11]
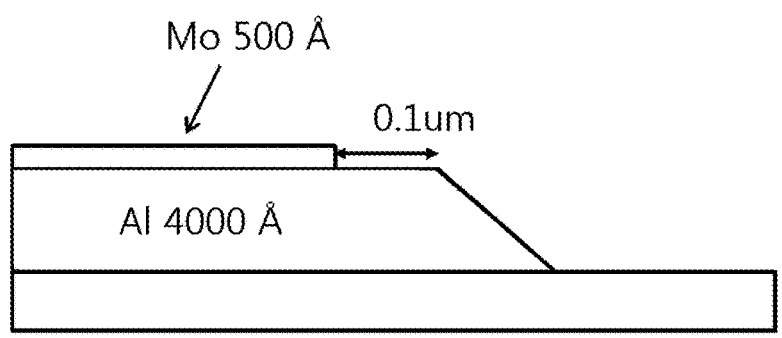

ELECTRODE LAMINATE AND ORGANIC LIGHT EMITTING DEVICE ELEMENT

TECHNICAL FIELD

This application is a National Stage Entry of International Application No. PCT/KR2014/006585, filed Jul. 21, 2014, and claims the benefit of Korean Application No. 10-2013-0085699, filed on Jul. 19, 2013, all of which are hereby incorporated by reference in their entirety for all purposes as if fully set forth herein.

The present specification relates to an electrode laminate and an organic light emitting device including the same.

BACKGROUND ART

Recently, the formation of transparent electrodes in an active picture unit has been required in electronic devices such as display, organic light emitting devices and touch panels. Transparent conductive films formed with materials such as ITO and ZnO have been used as electrodes in order to satisfy this requirement, however, these have serious problems in electric resistance. Particularly, in the case of illumination devices using an organic light emitting device, large electric resistance such as above may become a huge obstacle in commercialization when large-area illumination devices are formed. Accordingly, the development of transparent electrodes having reduced electric resistance even when large-area devices are formed has been required. Meanwhile, up to 30% of the light produced in an organic light emitting device is locked inside the device and causes a problem of reducing light emission efficiency.

DISCLOSURE

Technical Problem

After repeating many researches in order to improve electrical conductivity and/or light extraction efficiency of transparent electrodes, the inventors of the present invention have invented an electrode laminate having constitutions described in the present specification, and an organic light emitting device including the same.

Technical Solution

One embodiment of the present specification provides an organic light emitting device including a substrate, a first electrode provided on the substrate, a second electrode provided opposite to the first electrode, an organic material layer provided between the first electrode and the second electrode, and an auxiliary electrode of the first electrode, wherein the auxiliary electrode of the first electrode has a laminated structure of a first layer having reflectivity of 80% or greater at a wavelength of 550 nm and a second layer having a higher etching rate compared to the first layer, and the auxiliary electrode of the first electrode is either provided between the first electrode and the substrate or provided so that the first layer of the auxiliary electrode of the first electrode adjoins at least part of the side surface of the first electrode.

Another embodiment of the present specification provides an organic light emitting device in which the auxiliary electrode of the first electrode is provided adjoining the substrate.

Another embodiment of the present specification provides an organic light emitting device in which the first electrode is provided on the substrate in a pattern form, and the auxiliary electrode of the first electrode is provided in a pattern form adjoining at least part of the side surface of the first electrode pattern.

Another embodiment of the present specification provides an organic light emitting device further including an external light extraction layer provided on the surface opposite to the surface of the substrate on which the first electrode is provided.

Another embodiment of the present specification provides an electrode laminate including a substrate, an electrode provided on the substrate, and an auxiliary electrode electrically connecting to the electrode and has a laminated structure of a first layer having reflectivity of 80% or greater at a wavelength of 550 nm and a second layer having a higher etching rate compared to the first layer, wherein the auxiliary electrode is either provided between the electrode and the substrate, or provided so that the first layer of the auxiliary electrode adjoins at least part of the side surface of the electrode.

Another embodiment of the present specification provides an electrode laminate in which the auxiliary electrode is provided adjoining the substrate.

Another embodiment of the present specification provides an electrode laminate in which the electrode is provided on the substrate in a pattern form, and the auxiliary electrode is provided in a pattern form adjoining at least part of the side surface of the electrode pattern.

Another embodiment of the present specification provides an electrode laminate further including an external light extraction layer provided on the surface opposite to the surface of the substrate on which the electrode is provided.

Advantageous Effects

According to embodiments described in the present specification, by using an auxiliary electrode, of which the surface opposite to a substrate has reflectivity of 80% or greater at a wavelength of 550 nm, on the lower surface or the side surface of an electrode, resistance can be reduced even when electrodes or devices with large areas are manufactured, and in addition to this, efficiency of extracting the light produced in an organic material layer of an organic light emitting device out of the device can be improved without the light being locked inside the device by total reflection in between the device and an air layer or between each layer, and the like.

DESCRIPTION OF DRAWINGS

FIGS. 1 to 3 illustrate examples of electrode laminate constitutions according to embodiments of the present specification.

FIG. 4 illustrates an example of an existing auxiliary electrode.

FIG. 5 illustrates a structure of an electrode laminate prepared in Comparative Example 1.

FIGS. 6 and 7 show reflectivity of auxiliary electrode materials and reflectivity of a substrate.

FIGS. 8 and 9 illustrate line widths of a first layer and a second layer of an auxiliary electrode according to embodiments of the present specification.

FIG. 10 is a SEM picture of an auxiliary electrode prepared in examples.

FIG. 11 is a cross-sectional mimetic diagram of the SEM picture of FIG. 10.

MODE FOR DISCLOSURE

Hereinafter, embodiments of the present specification will be described in more detail.

An organic light emitting device according to one embodiment of the present specification includes a substrate, a first electrode provided on the substrate, a second electrode provided opposite to the first electrode, an organic material layer provided between the first electrode and the second electrode, and an auxiliary electrode of the first electrode, wherein the auxiliary electrode of the first electrode has a laminated structure of a first layer having reflectivity of 80% or greater at a wavelength of 550 nm and a second layer having a higher etching rate compared to the first layer, and the auxiliary electrode of the first electrode is either provided between the first electrode and the substrate, or provided so that the first layer of the auxiliary electrode of the first electrode adjoins at least part of the side surface of the first electrode.

According to one embodiment of the present specification, the first layer having reflectivity of 80% or greater at a wavelength of 550 nm is provided closer to the substrate than the second layer.

According to one embodiment of the present specification, the auxiliary electrode of the first electrode may be provided adjoining the substrate. FIGS. 1 to 3 each illustrate an example of the auxiliary electrode of the first electrode adjoining the substrate.

According to FIG. 1, the auxiliary electrode of the first electrode is provided so as to adjoin at least part of the side surface of the first electrode. Specifically, the first electrode is provided on the substrate in a pattern form, and the auxiliary electrode of the first electrode is provided in a pattern form adjoining at least part of the side surface of the first electrode pattern. Herein, the pattern is an expression distinguished from a whole surface layer, and means a form in which part of a bottom layer is covered and part of the bottom layer is exposed, not the whole surface of the bottom layer is covered. Herein, the shape of the covered part of the bottom layer is not particularly limited, and the shape may be formed as necessary depending on the purpose.

According to FIGS. 2 and 3, the auxiliary electrode of the first electrode is provided between the first electrode and the substrate.

When the auxiliary electrode of the first electrode has a structure illustrated in FIGS. 1 to 3, light extraction may be effectively achieved by reflecting the light at the interface of the auxiliary electrode of the first electrode and the substrate without the light releasing from a light emitting layer being locked inside the substrate. On the other hand, as seen in FIGS. 4 and 5, when a layer corresponding to a second layer of the auxiliary electrode is provided on the side adjoining the substrate, light extraction efficiency may be reduced since the light entering into the substrate may be absorbed to the layer corresponding to the second layer without releasing outside.

As seen above, the auxiliary electrode of the first electrode may be provided adjoining the substrate, however, additional layers may be provided between the auxiliary electrode and the substrate as necessary.

The auxiliary electrode of the first electrode is not particularly limited as long as the auxiliary electrode of the first electrode has better electrical conductivity than the first electrode. As constitutions to have favorable electrical conductivity, materials having high electrical conductivity may be used, or methods of making the auxiliary electrode thick may be used. For example, the first electrode is a transparent electrode, and the first and/or the second layer of the auxiliary electrode may be formed with metallic materials. The transparent electrode may have visible light transmittance of 60% or higher, preferably 70% or higher, more preferably 80% or higher, even more preferably 90% or higher, and even more preferably 95% or higher. As the transparent electrode material, transparent conductive oxides such as ITO and IZO may be used.

According to one embodiment of the present specification, the auxiliary electrode of the first electrode has a laminated structure of a first layer having reflectivity of 80% or greater at a wavelength of 550 nm and a second layer having a higher etching rate than the first layer.

The first layer has reflectivity of 80% or greater at a wavelength of 550 nm, therefore, light extraction may be improved by reflecting light at the interface between the first layer and a different layer such as a substrate. In the present specification, reflectivity may be calculated such that a target layer of which reflectivity is to be measured is deposited on a substrate, and reflectivity is measured from the side of the target layer of which reflectivity is to be measured, and then reflectivity of the substrate itself is subtracted.

Reflectivity may be measured using CM3700A manufactured by Konica Minolta, Inc., however, the equipment is not limited thereto. Reflectivity may be affected by the thickness of a layer as well as the material that forms the layer. The material, the thickness and the like of the first layer may be selected so that the first layer has reflectivity described above.

According to one embodiment, the first layer of the auxiliary electrode of the first electrode has reflectivity of 85% or greater at a wavelength of 550 nm.

According to one embodiment, the first layer of the auxiliary electrode of the first electrode has reflectivity of 80% or greater at a wavelength of 500 nm to 650 nm.

According to one embodiment, the first layer of the auxiliary electrode of the first electrode has reflectivity of 85% or greater at a wavelength of 500 nm to 650 nm.

According to one embodiment, the first layer of the auxiliary electrode of the first electrode has reflectivity of 80% or greater at a wavelength of 450 nm to 650 nm.

According to one embodiment, the first layer of the auxiliary electrode of the first electrode has reflectivity of 85% or greater at a wavelength of 450 nm to 650 nm.

As the material of the first layer, materials having higher electrical conductivity than the first electrode are preferably used.

The material of the first layer includes Al, Ag, Al alloys, Ag alloys and the like. Herein, the alloy means including one or more types of additional metals. For example, an Ag alloy may include Cu, Pd and the like in addition to Ag. Nonlimiting examples of the Ag alloy include AgCu, AgPd, AgCuPd and the like. The ratio of the two or more metals included in the alloy may be adjusted as necessary.

Reflectivity at a thickness of 100 nm of materials capable of being used as the materials of the first layer is shown in FIG. 6. In FIG. 6, CORA 0500 and CORA 0505 are product names of alloys manufactured by COMET Inc.

The Line width and the thickness of the first layer may be adjusted depending on target reflectivity, electrical conductivity and the like. For example the thickness of the first layer may be selected within a range of 500 angstroms to 10,000 angstroms.

The second layer is a layer having a higher etching rate than the first layer. Herein, having a higher etching rate means being etched at a higher speed than the first layer when etching the laminated structure of the first layer and the second layer with an identical etching solution composition. By using the second layer having such properties, a proper taper angle of the first layer may be obtained. Due to such a proper taper angle, a first electrode provided thereon, for example, a transparent conductive oxide layer such as an ITO layer may be stably formed. The proper taper angle may be affected by the types of an etching solution or an etching condition as well as the materials of the first layer and the second layer described above, and in order to obtain the proper taper angle described above, those skilled in the art may select the materials of each layer, the types of an etching solution or an etching condition based on the technologies known in the related art. For example, as the etching condition, when a just etching time is 50 seconds at 50° C., over-etching may be achieved by etching for a period of 200% to 600% of the just etching time, for example, a period of 300% to 500%.

According to one embodiment, the etching rate of the second layer is 500 angstroms/s or higher at 50° C., and the etching rate of the first layer is 100 angstroms/s or lower.

According to one embodiment, the etching rate of the second layer is 800 angstroms/s or higher at 50° C., and the etching rate of the first layer is 800 angstroms/s or lower.

According to one embodiment, the side surface of the first layer has a regular taper angle. The taper angle ($\theta$) in the present specification means an angle that the side surface and the lower surface of the first layer form as illustrated in FIG. 3, and the regular taper angle means that the angle is an acute angle.

According to one embodiment, the taper angle of the first layer of the auxiliary electrode is greater than 0° and less than 90°. According to one embodiment, the taper angle of the first layer of the auxiliary electrode is preferably greater than 0° and less than or equal to 60°. The taper angle of the first layer is the smaller the better for the stability of the layers provided thereon.

When the first electrode has a regular taper angle as described above, the light generated from an organic material layer provided on the top of the auxiliary electrode reflects not only from between the first layer of the auxiliary electrode and the substrate, but also from the side surface of the first layer, and as a result, light extraction efficiency may be further improved, and in addition to this, the first electrode may be formed stably on the laminated structure of the auxiliary electrode. In FIG. 3, the direction of the light emitting from an organic material layer provided on the top of the auxiliary electrode is expressed as arrows.

According to one embodiment, in the auxiliary electrode, the ratio of an upper surface line width (a') of the first layer with respect to a lower surface line width (a) of the first layer is less than 1. FIG. 8 illustrates the line width of the first layer of the auxiliary electrode. Herein, when the boundary of the lower surface and the side surface of the first layer forms a curved surface, or the boundary of the upper surface and the side surface of the second layer forms a curved surface, the lower surface line width of the first layer is measured based on the side that an extended surface of the surface adjoining the substrate and an extended surface of the side surface of the first layer meet, and the upper surface of the first layer is measured based on the side that an extended surface of the upper surface of the first layer and an extended surface of the side surface of the first layer meet.

According to one embodiment, the line width of the first layer of the auxiliary electrode gradually increases from the upper surface to the lower surface.

According to one embodiment, in the auxiliary electrode, a lower surface line width (b) of the second layer is the same as or smaller than an upper surface line width (a') of the first layer. A constitution such as this is illustrated in FIG. 9.

According to one embodiment, in the auxiliary electrode, the difference between the lower surface line width (b) of the second layer and the upper surface line width (a') of the first layer ranges from 0.01 micrometers to 1 micrometers, for example, ranges from 0.05 micrometers to 0.5 micrometers, and specifically is 0.2 micrometers.

According to the embodiment, for any one or more types of etching solutions, the types of the etching solution is not limited as long as the etching rate of the second layer is higher than the etching rate of the first layer as described above.

According to one embodiment of the present invention, the first layer and the second layer of the auxiliary electrode may use materials etched by an acid-including etching solution. As one example, the etching solution may include one or more types of phosphoric acid, nitric acid and acetic acid.

According to one embodiment, when the second layer is exposed to moisture or air, the second layer has lower degree of oxidation than the first layer. In this case, the oxidation of the first layer may be prevented at least at the interface between the first layer and the second layer even when the first layer is exposed to moisture or air.

According to one embodiment, the second layer has higher hardness than the first layer. In this case, the auxiliary electrode may be protected from external physical damages even when the first layer has low hardness. In addition, when thermal expansion coefficients of the first layer and the substrate are different, hillock, a phenomenon in which the first layer expands when being thermal-treated, may occur, however, hillock defects such as above may be prevented when the second layer has higher hardness than the first layer.

The material of the second layer includes Mo and the like.

The line width and the thickness of the second layer may be determined depending on target electrical conductivity or the taper angle of the auxiliary electrode. The thickness of the second layer may range from 10 to 5,000 angstroms, for example, range from 12.5 to 3,500 angstroms, and specifically range from 62.5 to 1,250 angstroms.

According to one embodiment, in the auxiliary electrode, the ratio of the thickness of the second layer with respect to the thickness of the first layer ranges from 1/40 to 1/3, and for example, may be 1/8. When the thickness ratio is within the range described above, a regular taper angle of the first layer, and properties such as oxidation prevention and superior hardness may be provided when necessary, while proper properties of the auxiliary electrode may be provided depending on the reflectivity and the electrical conductivity of the first layer.

According to one embodiment of the present specification, the first layer is an Al layer, and the second layer is a Mo layer. FIG. 7 shows the reflectivity of the Al layer having a thickness of 4,000 angstroms and the Mo layer having a thickness of 500 angstroms. Herein, the reflectivity of the Al layer having a thickness of 4,000 angstroms is 86.77% at a wavelength of 550 nm, and the reflectivity of the Mo layer having a thickness of 500 angstroms is 44.57% at a wavelength of 550 nm.

In the present specification, as the material of the second electrode, those known in the related art may be used. For example, metals, transparent conductive oxides, conductive polymers or the like may be used. The second electrode material may be the same as or different from the first electrode material.

In the present specification, as the material of the organic material layer, those known in the related art may be used. For example, the organic material layer may be formed with a single light emitting layer, or with multilayers further including layers that inject or transfer charges such as a hole injection layer, a hole transfer layer, an electron transfer layer and an electron injection layer, in addition to a light emitting layer. Additional functional layers such as a hole blocking layer, an electron blocking layer and a buffer layer may also be provided. An inorganic layer such as metal halogenides, an organometallic layer or an inorganic material-doped organic material layer may be used as necessary.

According to one embodiment of the present specification, an external light extraction layer is further provided on the surface opposite to the surface of the substrate on which the first electrode is provided. The inventors of the present invention have identified that, when using the structures of the auxiliary electrode according to the embodiments described above, an increase in the light extraction effect due to the use of the external light extraction layer is bigger, compared to cases that does not use an auxiliary electrode or uses an auxiliary electrode having different structures. This may be demonstrated through the examples described later.

The structure of the external light extraction layer is not particularly limited as long as it has a structure capable of inducing light scattering and improving light extraction efficiency of devices. In one embodiment, the external light extraction layer may be formed using a film having a structure in which scattered particles are dispersed inside a binder, or using a film having an uneven structure.

In addition, the external light extraction layer may be directly formed on a substrate using methods such as spin coating, bar coating and slit coating, or may be formed by being prepared in a film form and then attached to a substrate. The external light extraction layer may include a planarizing layer.

One embodiment of the present specification further includes an internal light extraction layer provided between the first electrode or the auxiliary electrode and the substrate. The structure of the internal light extraction layer is not particularly limited as long as it has a structure capable of inducing light scattering and improving light extraction efficiency of devices. In one embodiment, the internal light extraction layer may be formed using a film having a structure in which scattered particles are dispersed inside a binder, or using a film having an uneven structure.

In addition, the internal light extraction layer may be directly formed on a substrate using methods such as spin coating, bar coating and slit coating, or may be formed by being prepared in a film form and then attached to a substrate. The internal light extraction layer may include a planarizing layer.

According to one embodiment of the present specification, the organic light emitting device may further include an insulation layer. As one example, the insulation layer may be provided so as to surround at least part of the or the whole surface excluding the surface adjoining the first electrode of the auxiliary electrode of the first electrode. As another example, the auxiliary electrode of the first electrode is provided between the substrate and the first electrode, and the insulation layer is additionally provided on the region covering the auxiliary electrode out of the first electrode upper surface. The insulation layer may prevent the first electrode or the auxiliary electrode of the first electrode being electrically connected to the second electrode or other components. The material of the insulation layer is not particularly limited, however, PSPI may be used.

According to one embodiment of the present specification, the organic light emitting device is a flexible organic light emitting device. In this case, the substrate includes flexible materials. For example, a flexible thin film-shaped glass substrate, a plastic substrate or a film-shaped substrate may be used.

The material of the plastic substrate is not particularly limited, however, films such as PET, PEN, PEEK and PI are generally used in a monolayer or multilayer form.

When the substrate is formed as a thin film, additional plastic substrates may be attached thereto. For example, a laminate of thin film-shaped glass and plastic substrates may be used as the substrate. Attaching plastic substrates to thin film-shaped glass may improve mechanical properties.

One embodiment of the present specification provides a display device including the organic light emitting device described above. The organic light emitting device may function as a pixel or a backlight in the display device. The constitution of the display device in addition to this may use constitutions known in the related art.

One embodiment of the present specification provides an illumination device including the organic light emitting device described above. The organic light emitting device functions as a light emitting unit in the illumination device. The constitution of the illumination device in addition to this may use constitutions known in the related art.

Another embodiment of the present specification an electrode laminate including a substrate, an electrode provided on the substrate, and an auxiliary electrode electrically connecting to the electrode and has a laminated structure of a first layer having reflectivity of 80% or greater at a wavelength of 550 nm and a second layer having a higher etching rate compared to the first layer, wherein the auxiliary electrode is either provided between the electrode and the substrate, or provided so that the first layer of the auxiliary electrode adjoins at least part of the side surface of the electrode.

According to one embodiment, the electrode is provided on the substrate in a pattern form, and the auxiliary electrode may be provided in a pattern form so as to adjoin at least part of the side surface of the electrode pattern.

In the electrode laminate described in the present specification, the descriptions on the first electrode and the auxiliary electrode of the first electrode in the embodiments relating to the organic light emitting device described above may be applied to the electrode and the auxiliary electrode, respectively. As for additional constitutions in addition to the first electrode and the auxiliary electrode of the first electrode, such as constitutions including a substrate, an external light extraction layer, an internal light extraction layer, an insulation layer and the like, the descriptions in the embodiments relating to the organic light emitting device may also be applied to the electrode laminate.

Hereinafter, the embodiments described above will be described in more detail with reference to examples. However, the following examples are for illustrative purposes only, and the scope of the present specification is not limited thereto.

EXAMPLE 1

An auxiliary electrode pattern was formed on a glass substrate as a laminated structure of Al (thickness of 4,000 angstroms) and Mo (thickness of 500 angstroms), and an ITO layer was formed as a first electrode on the substrate and the auxiliary electrode pattern. Herein, a taper angle of the Al layer of the auxiliary electrode was within the range of 30° to 60°.

A SEM picture of the Al and Mo laminated structure prepared in the example is shown in FIG. 10. According to FIG. 10, the distance from one end unit of the lower surface of the Mo layer to one end unit of the upper surface of the Al layer is 0.1 micrometers. FIG. 11 is a mimetic diagram of SEM cross section of FIG. 10.

Subsequently, a light emitting layer and a second electrode were formed on the first electrode, and an organic light emitting device was manufactured.

EXAMPLE 2

Example 2 was carried out in the same manner as in Example 1 except that OCF (external light extraction layer) was additionally formed on the side opposite to the surface of the substrate on which the auxiliary electrode is provided.

COMPARATIVE EXAMPLE 1

An auxiliary electrode pattern was formed on a glass substrate in a Mo/Al/Mo laminated structure, and a first electrode was formed on the substrate and the auxiliary electrode pattern. Herein, the Mo layer was formed to a thickness of 500 angstroms, and the Al layer was formed to a thickness of 4,000 angstroms, and an ITO layer was used as the first electrode.

COMPARATIVE EXAMPLE 2

Comparative Example 2 was carried out in the same manner as in Comparative Example 1 except that OCF (external light extraction layer) was additionally formed on the side opposite to the surface of the substrate on which the auxiliary electrode is provided.

Properties of the devices manufactured in the examples and the comparative examples were measured and shown in the following table.

TABLE 1

| Category | Voltage (V) | lm | LE (lm/W) | QE (%) | CCT (K) | Duv | CRI-Ra (%) | CRI-R9 (%) | Color Compensation lm | Color Compensation LE (lm/W) |
|---|---|---|---|---|---|---|---|---|---|---|
| Comparative Example 1 | 5.80 | 46.8 | 35.0 | 30.7 | 4253.3 | 0.0051 | 87.5 | 71.6 | — | — |
| Comparative Example 2 | 5.78 | 67.0 | 50.4 | 42.3 | 4011.4 | 0.0028 | 90.7 | 46.3 | 66.2 | 49.7 |
| Example 1 | 5.78 | 49.4 | 37.2 | 32.8 | 3994.4 | −0.0034 | 84.8 | 69.5 | — | — |
| Example 2 | 5.79 | 72.7 | 54.5 | 46.2 | 3932.4 | 0.0006 | 90.2 | 46.8 | 74.1 | 55.6 |

In Table 1, lm means luminance, that is, the brightness of light, LE represents light emission efficiency, that is, the brightness of light with respect to power consumption, QE is the number of photons and represents the number of particles emitting light, CCT is a color temperature, and represents red series when the value is low, and blue series when the value is high. Duv is a color variation, and as the number decreases, more superior effects are obtained.

According to Table 1, the color compensation efficiency of Example 1 increased by 11% or greater compared to the color compensated efficiency of Comparative Example 2, and the number of photons also increased by 9% or greater.

In the above examples and the comparative examples, the percentages of the improvements in effects after including OCF (external light extraction layer) compared to before the inclusion are shown in the following Table 2.

TABLE 2

| Category | lm | LE (lm/W) | QE (%) | CRI-Ra (%) |
|---|---|---|---|---|
| Percentage of Increase in Comparative Example 2 With Respect To Comparative Example 1 | 43.3% | 44.0% | 37.9% | 3.6% |
| Percentage of Increase in Example 2 With Respect To Example 1 | 47.1% | 46.7% | 40.9% | 6.4% |
| Percentage of Increase in Example With Respect To Comparative Example | 3.8% | 2.7% | 2.9% | 2.8% |

As shown in Table 2, it can be seen that performances of a device is further improved in the examples when OCF (external light extraction layer) is included, compared to the comparative examples.

The invention claimed is:

1. An organic light emitting device comprising:
a substrate;
a first electrode provided on the substrate;
a second electrode provided opposite to the first electrode;
an organic material layer provided between the first electrode and the second electrode, wherein the first electrode is provided between the substrate and the organic material layer;
an auxiliary electrode of the first electrode; and
an internal light extraction layer between the first electrode and the substrate,
wherein the auxiliary electrode of the first electrode has a laminated structure of a first layer having reflectivity of 80% or greater at a wavelength of 550 nm and a second layer having a higher etching rate compared to the first layer,
wherein the auxiliary electrode of the first electrode is provided so that a part, not the whole, of the lateral surface of the first layer of the auxiliary electrode contacts the lateral surface of the first electrode, and the first layer of the auxiliary electrode contacts the lateral surface of the first electrode without contacting any other parts of the first electrode,
wherein a lower surface line width (b) of the second layer is smaller than an upper surface line width (a') of the first layer,
wherein the lower surface line width (b) of the second layer is a line width of a surface which meets an upper surface of the first layer,
wherein the organic material layer is vertically on the second layer of the auxiliary electrode, and,
wherein the first electrode is a transparent electrode.

2. The organic light emitting device of claim 1, wherein the first layer having reflectivity of 80% or greater at a wavelength of 550 nm is provided closer to the substrate than the second layer.

3. The organic light emitting device of claim 1, wherein the first layer having reflectivity of 80% or greater at a wavelength of 550 nm is provided contacting the substrate.

4. The organic light emitting device of claim 1, wherein the first electrode is provided on the substrate in a pattern form, and the first layer of the auxiliary electrode of the first electrode is provided in a pattern form so as to contact the lateral surface of the first electrode pattern.

5. The organic light emitting device of claim 1, wherein a ratio of an upper surface line width (a') of the first layer with respect to a lower surface line width (a) of the first layer is less than 1.

6. The organic light emitting device of claim 1, wherein the first layer is an Al layer, and the second layer is a Mo layer.

7. The organic light emitting device of claim 1, wherein a taper angle of the auxiliary electrode of the first electrode is greater than 0° and less than or equal to 60°.

8. The organic light emitting device of claim 1, wherein, in the auxiliary electrode, a ratio of a thickness of the second layer with respect to a thickness of the first layer ranges from 1/40 to 1/3.

9. The organic light emitting device of claim 1 further comprising an external light extraction layer provided on the surface opposite to the surface of the substrate on which the first electrode is provided.

10. The organic light emitting device of claim 9, wherein the external light extraction layer includes a planarizing layer.

11. The organic light emitting device of claim 1, wherein the internal light extraction layer includes a planarizing layer.

12. The organic light emitting device of claim 1, which is a flexible organic light emitting device.

13. A display device comprising the organic light emitting device of claim 1.

14. An illumination device comprising the organic light emitting device of claim 1.

15. An electrode laminate comprising:
a substrate;
an electrode provided on the substrate;
an auxiliary electrode electrically connecting to the electrode and has a laminated structure of a first layer having reflectivity of 80% or greater at a wavelength of 550 nm and a second layer having a higher etching rate compared to the first layer; and
an internal light extraction layer between the electrode and the substrate,
wherein the auxiliary electrode is provided so that a part, not the whole, of the lateral surface of the first layer of the auxiliary electrode contacts the lateral surface of the electrode, and the first layer of the auxiliary electrode contacts the lateral surface of the electrode without contacting any other parts of the electrode,
wherein a lower surface line width (b) of the second layer is smaller than an upper surface line width (a') of the first layer,
wherein the lower surface line width (b) of the second layer is a line width of a surface which meets an upper surface of the first layer, and
wherein a difference between the lower surface line width (b) of the second layer and the upper surface line width (a') of the first layer ranges from 0.01 to 1 micrometer, and
wherein the electrode is a transparent electrode.

16. The electrode laminate of claim 15, wherein the first layer having reflectivity of 80% or greater at a wavelength of 550 nm is provided closer to the substrate than the second layer.

17. The electrode laminate of claim 15, wherein the first layer having reflectivity of 80% or greater at a wavelength of 550 nm is provided contacting the substrate.

18. The electrode laminate of claim 15, wherein the electrode is provided on the substrate in a pattern form, and the first layer of the auxiliary electrode of the electrode is provided in a pattern form so as to contact the lateral surface of the electrode pattern.

19. The electrode laminate of claim 15, wherein a ratio of an upper surface line width (a') of the first layer with respect to a lower surface line width (a) of the first layer is less than 1.

20. The electrode laminate of claim 15, wherein the first layer is an Al layer, and the second layer is a Mo layer.

21. The electrode laminate of claim 15, wherein a taper angle of the auxiliary electrode of the electrode is greater than 0° and less than or equal to 60°.

22. The electrode laminate of claim 15, wherein, in the auxiliary electrode, a ratio of a thickness of the second layer with respect to a thickness of the first layer ranges from 1/40 to 1/3.

23. The electrode laminate of claim 15 further comprising an external light extraction layer provided on the surface opposite to the surface of the substrate on which the electrode is provided.

24. The electrode laminate of claim 23, wherein the external light extraction layer includes a planarizing layer.

25. The electrode laminate of claim 15 further comprising an internal light extraction layer provided between the electrode or the auxiliary electrode and the substrate.

26. The electrode laminate of claim 25, wherein the internal light extraction layer includes a planarizing layer.

* * * * *